United States Patent
Kim et al.

(10) Patent No.: US 7,049,162 B2
(45) Date of Patent: May 23, 2006

(54) TRANSISTOR ARRAY SUBSTRATE FABRICATION FOR AN LCD

(75) Inventors: Jeong-Rok Kim, Gyungsangbuk-Do (KR); Kyung-Kyu Kang, Gyungsangnam-Do (KR); Jae-Deuk Shin, Busan (KR); Jo-Hann Jung, Gyungsangbuk-Do (KR); Myung-Woo Nam, Gyungsangbuk-Do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 87 days.

(21) Appl. No.: 10/712,939

(22) Filed: Nov. 13, 2003

(65) Prior Publication Data
US 2004/0126950 A1    Jul. 1, 2004

(30) Foreign Application Priority Data
Dec. 28, 2002    (KR)    .................. 10-2002-0086112

(51) Int. Cl.
*H01L 21/00*    (2006.01)

(52) U.S. Cl. .................. 438/30; 438/48; 349/149
(58) Field of Classification Search .................. 438/30, 438/48, 22–24, 128, 149; 257/59, 72, 82; 349/149, 110, 158
See application file for complete search history.

(56) References Cited

U.S. PATENT DOCUMENTS 6,762,081 B1 *   7/2004   Yamazaki et al. .......... 438/150
6,797,535 B1 *   9/2004   Tanabe ........................ 438/48

* cited by examiner

*Primary Examiner*—Dung A. Le
(74) *Attorney, Agent, or Firm*—Brinks Hofer Gilson & Lione

(57) ABSTRACT

A fabrication process for transistor array substrates of different sizes on a common substrate provides quality control, yield, and space efficiency advantages. In particular, a four-mask process, including a mask with diffraction slits, may be employed to fabricate transistors that share common channel characteristics for each of the transistor array substrates.

10 Claims, 5 Drawing Sheets

TRANSISTOR ARRAY SUBSTRATE FABRICATION FOR AN LCD

This application claims the benefit of priority to Kprean Patent Application No. 2002-86112 filed on Dec. 28, 2002.

BACKGROUND OF THE INVENTION

1. Field of the Invention

The present invention relates to substrate fabrication for a Liquid Crystal Display (LCD). More specifically, this invention relates to fabricating, on a common substrate, LCD transistor array substrates for LCD devices that differ in size.

2. Description of the Background Art

A liquid crystal display device includes a thin film transistor (TFT) array substrate and a liquid crystal panel including a color filter substrate facing the TFT array substrate. The TFT array substrate includes gate lines arranged in parallel in a column direction, data lines crossing the gate lines at right angles to form a matrix, thin film switching transistors formed proximate to intersections of each gate line and data line, and pixel electrodes that apply electric fields to the liquid crystal when a data signal is applied from a data line through a drain electrode of the TFT.

The color filter substrate includes: a black matrix that blocks peripheral light generated by the back light, a color filter including color resins of red, green and blue colors for realizing the pixel colors; and a common electrode for applying an electric field in concert with the pixel electrodes on the TFT array substrate to selectively orient the liquid crystal. The liquid crystal is filled between the color filter substrate and the TFT array substrate.

Typically, the liquid crystal display (LCD) panel is manufactured by separately fabricating the TFT array substrate and the color filter substrate and subsequently attaching the two substrates together. Liquid crystal is then filled between the color filter substrate and the TFT array substrate to form the LCD panel of the LCD device.

As described above, the color filter substrate and the TFT array substrate of the LCD device are fabricated on different processing lines. There is a wide variance in the size and shape of LCD panels needed for LCD devices. As a result, there is a significant number of differently sized color filter substrates and TFT array substrates that a manufacturer may be need in order to produce complete LCD panels for many different products.

Generally, the TFT array substrate and the color filter substrate are each fabricated on a glass substrate. With regard to the TFT array substrate, the glass substrate on which the TFT array substrate is formed is commonly much larger than any particular TFT array substrate for any particular LCD device. As a result, multiple TFT array substrates are fabricated at different locations on the common glass substrate. Each TFT array substrate may have the same size, and be destined for the same type of LCD device (e.g., a portable phone), or the TFT array substrates may vary in size and shape and be destined for multiple different types of LCD devices.

FIG. 1 shows an example in which a common glass substrate 101 is used to fabricate multiple TFT array substrates 102. Each TFT array substrate 102 has the same size. Because each TFT array substrate 102 has the same size, a common set of masks may be used to fabricate the TFT array substrates 102. As a result, all of the TFT array substrates 102 may be fabricated under the same fabrication conditions, have the same properties, be tested in a common manner, and thereby allow efficient mass production.

An overall summary of producing TFT array substrates on a common glass substrate is presented next. First, the fabrication areas are assigned for the TFT array substrates, typically to form as many TFT array substrates as possible on a single common glass substrate. Subsequently, gate lines are fabricated where desired in the fabrication areas, along with TFT switching devices, signal lines, and supporting structure. Next, an insulating passivation layer is applied over the entire glass substrate and the pixel electrodes are formed.

After forming the pixel electrodes, an alignment layer for free alignment of the liquid crystal is formed on the glass substrate. A rubbing process may then be carried out, for example, by rubbing the alignment layer with a cloth. After the rubbing process, a seal pattern is printed on an outer portion of an active area of each unit TFT array substrate. The seal patterns individually seal the unit TFT array substrates to color filter substrates.

The seal pattern is generally formed by a screen mask method. This method prints the seal pattern using a screen on which the seal pattern is formed. The seal pattern may also by formed using a dispenser method that draws the seal pattern with a dispenser delivering the sealant.

The screen mask method is useful for mass production, but has the disadvantage that it is susceptible to alignment errors due to contact between the seal pattern screen and an alignment layer on each TFT array substrate. On the contrary, the sealant dispenser method has the advantage of precise seal pattern, but is less suitable for mass production due to its relatively slower speed.

In addition, spacers are scattered onto each TFT array substrate. The spacers maintain a pre-selected separation between the TFT array substrates and the color filter substrates (when they are attached) The color filter substrates, also supported on a common glass substrate but prepared by a different fabrication process are then sealed to the TFT array substrates using the seal pattern. Heat and pressure are applied to bond the color filter substrates to the TFT array substrates.

Subsequently, individual unit LCD panels are cut apart, and the liquid crystal is injected into each LCD panel through an injection hole. The injection hole is sealed afterward to complete the fabrication of the LCD panel for the LCD device.

In the processes described above, the common glass substrate was used to produce multiple identical LCD panels. As a result, all components of the TFT array substrates formed on common glass substrate have same manufacturing standards and characteristics.

However, when the common glass substrate is used to manufacture TFT array substrates that differ in size and shape, then the resultant LCD panels, and their underlying components, will adhere to differing manufacturing standards and characteristics. The common glass substrate is sometimes used in this manner because the common glass substrate is not always an integral multiple of a certain TFT array substrate size. Thus, to more efficiently use the glass substrate, it may be desirable to fill what would be unused area with TFT array substrates of other sizes.

For example, the common glass substrate may be employed to manufacture both an 8-inch LCD panel and a 14-inch LCD panel. In that case, the TFT channels in each TFT array substrate are manufactured with different masks and therefore adhere to different manufacturing standards and device characteristics. As a result, quality control (e.g., performance testing) for each different LCD panel must be carried out independently. Independent testing, however, increases the cost and time required to exercise quality control, and thus frustrates mass production. Furthermore, an improvement developed for fabricating a particular TFT (e.g., an improvement in channel performance) generally cannot be applied to other TFTs for different TFT array substrates.

As a result, it has been very complex to fabricate TFT array substrates for different LCD panels on a common glass substrate. In part, the complexity is due to applying different mask processes for each different TFT array substrate. For example, the TFTs incorporated in the 14-inch LCD panel are fabricated using a different mask set than the TFTs incorporated into the 8-inch LCD panel. Inferiorities are easily generated, and yield commonly decreases.

There is a need for addressing the problems noted above, and others previously experienced.

SUMMARY OF THE INVENTION

One advantage of the transistor array substrate fabrication explained below is that TFT array substrates of many different sizes, for many different models of LCD panels, may be fabricated according to a common standard. As a result, the quality control becomes less time consuming and less costly. Because TFT array substrates of many different sizes may be fabricated, space efficiency for the common glass substrate is improved.

In one implementation, the TFT array substrates include thin film transistors (TFTs) fabricated by applying a four-mask process to a glass substrate. The glass substrate is common to multiple TFT array substrates of different sizes for various LCD panel modes. Thus, quality control may be performed for all the TFT array substrates in relation to the four-mask process that is common to all the substrates.

The fabrication process steps that allow the TFTs to share the common standard include preparing a substrate, determining areas on which TFT array substrates of different sizes will be formed on the substrate, and forming TFTs using a multiple mask process including a diffraction slit mask that determines the TFT channels. Additionally, fabrication of the LCD panel may also include forming an alignment layer, forming a seal pattern, scattering spacers, and attaching the TFT array substrate to a color filter substrate. The fabrication process also includes cutting the attached liquid crystal display panel into individual unit cells or LCD panels, injecting liquid crystal through a liquid crystal injecting hole, and sealing the liquid crystal injecting hole.

In one embodiment, a fabrication method for multiple LCD panel models from transistor array substrates formed on a common substrate is provided. The method comprises the steps of: selecting areas on the common substrate where switching array substrates of different sizes will be formed; fabricating switching devices using a common set of masks for each of the switching array substrates; forming an alignment layer on each of the transistor array substrates; forming a seal pattern around each of the transistor array substrates; scattering spacers onto each transistor array substrate; attaching the common substrate on which the switching devices are formed to a color filter substrate to form an LCD display panel; cutting the LCD display panel into individual LCD panel models; and disposing liquid crystal in each of the panel models through a liquid crystal injecting hole.

In another embodiment, a fabrication method for multiple transistor array substrates on a common substrate for multiple LCD panel models comprises the steps of: selecting areas on the common substrate where switching array substrates of different sizes will be formed; and fabricating the switching devices for each switching array substrate, regardless of size, through a multiple-mask process that applies the same masks for each switching array substrate.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Reference will now be made in detail to an exemplary implementation of the present invention, illustrated in the accompanying drawings. As will be explained in more detail below, array substrates areas of various sizes are selected for a common glass substrate, and then TFT array substrates are formed in those areas in order to fabricate various models of LCD panels using the same TFT fabrication process for each TFT array substrate.

Figure 1:
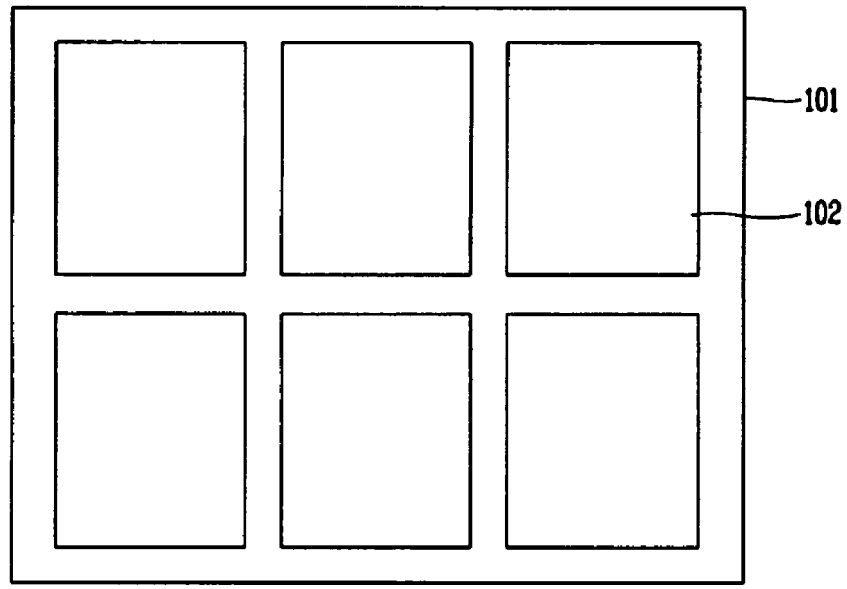
FIG. 1 shows multiple identical TFT array substrates positioned on a common glass substrate.
Figure 2:
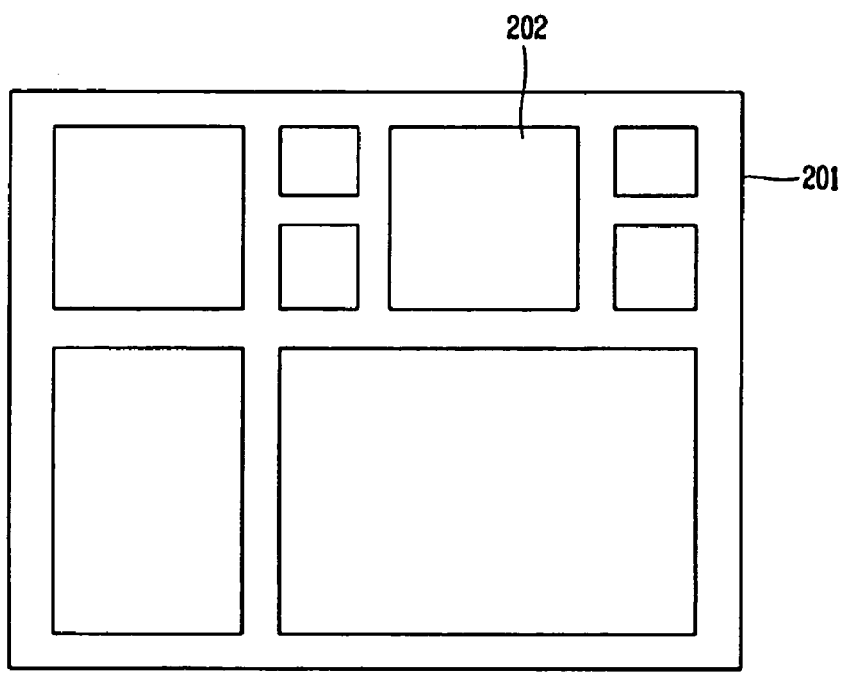
FIG. 2 illustrates multiple TFT array substrates of varying sizes arranged on a common glass substrate.

FIG. 2 shows TFT array substrates 202 of various sizes disposed on a common glass substrate 201 that will yield LCD panels of various sizes when fabrication is complete. Initially, the area that each TFT array substrate 202 will occupy is decided and assigned to the common glass substrate 201, followed by the fabrication steps that create the TFT array substrates.

In one implementation, the TFT array substrates 202 are arranged on the glass substrate 201 by arranging the TFT array substrates 202 along straight lines to allow effective cutting (i.e., separation) of the glass substrate 201 into individual TFT array substrates. More generally, the TFT array substrates 202 are arranged away from a cutting line followed by a cutting device. The arrangement of TFT array substrates 202 of different sizes may be designed to efficiently use the area provided by the glass substrate 201.

As will be explained in more detail below, the fabrication process applies a common diffraction slit mask to form TFT channels for each of the TFT array substrates 202. Therefore, the TFTs share a common fabrication standard and may be more efficiently tested for quality.

FIG. 3 illustrates the fabrication processes for the TFT array substrates 202. In one embodiment, the fabrication process applies four masks to create each TFT switching device.

Figure 3A:
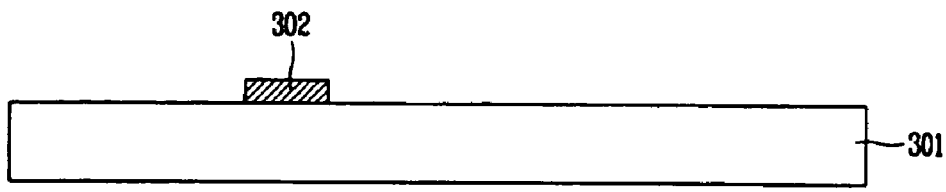
FIGS. 3A through 3H are processing views showing TFT fabrication steps for a four-mask process that may be employed for each TFT array substrate regardless of size on a common glass substrate.

As shown in FIG. 3A, gate electrode material 302 is formed on the entire surface of the common glass substrate 301 on which the TFT array substrate areas were defined. A sputtering method, for example, may deposit the electrode material 302 to form a metal thin film by scattering target material due to crashes of inert ions accelerated by electric field onto the target. The electrode material 302 may be an Aluminum (Al) alloy, including an alloy of Aluminum and Molybdenum (Mo) suitable as gate electrode material.

After depositing the gate electrode material 302 on the surface of the glass substrate 301, a photolithography process exposes a first mask on which TFT gate lines are patterned. The photolithography process also includes applying photoresist, exposing the photoresist, and etching. The first mask is employed to fabricate the TFT gate lines called for in each TFT array substrate 202. As a result, gate line patterns of the same size are formed in the areas assigned to each TFT array substrate on the common glass substrate 301.

Figure 3B:
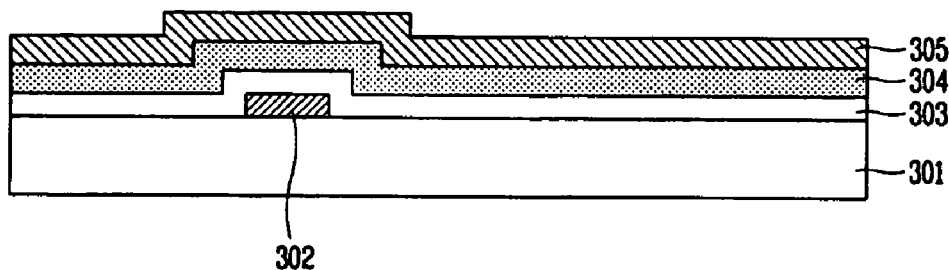

Next, as shown in FIG. 3B, a gate insulating layer 303 (as examples, SiNx or SiO2), an active layer 304, and a conductive layer 305 made, for example, from the gate electrode material 302, are sequentially formed over the upper surface of the glass substrate 301 on which the gate lines were formed. The active layer 304 comprises an amorphous silicon (a-Si) semiconductor layer. The conductive layer 305 is formed on an upper part of the active layer 304, which may be an N+ layer of high concentration for ohmic contacting.

Figure 3C:
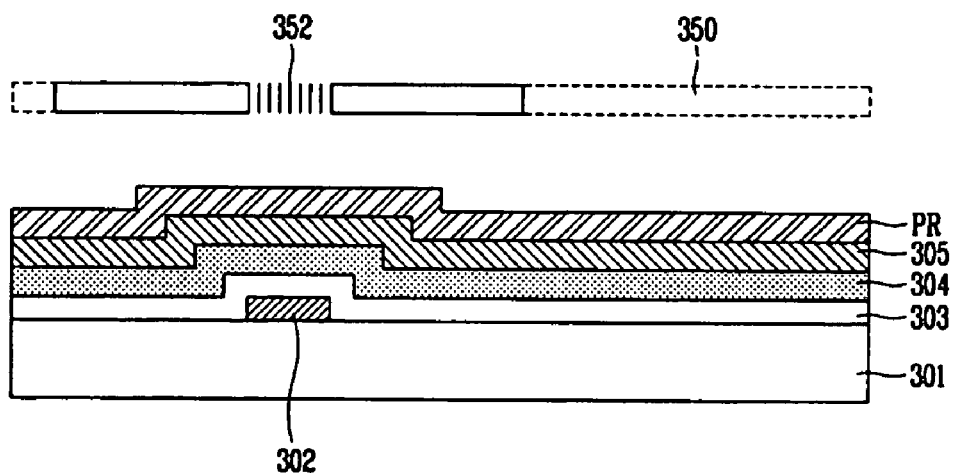

Subsequently, as shown in FIG. 3C, photoresist (PR) is formed on an upper part of the conductive layer 305 and the photoresist PR is selectively patterned by performing photolithography processes in concert with a second mask 350. The second mask 350 includes a diffraction slit 352 that produces a diffraction exposure of the photoresist PR above the channel area of the TFT. In this regard, the diffraction exposure is applied to the photoresist PR on the upper part of the conductive layer 305 over the TFT channel area of the active layer 304. As a result, the photoresist PR thickness may be controllably reduced over the TFT channel regions compared to the photoresist thickness in the remaining regions (as shown by reference characters 354 and 356 in FIG. 3D). Because a portion of the photoresist PR is removed to make the selected area thinner, different degrees of etching may be employed to help form the TFTs.

Figure 3D:
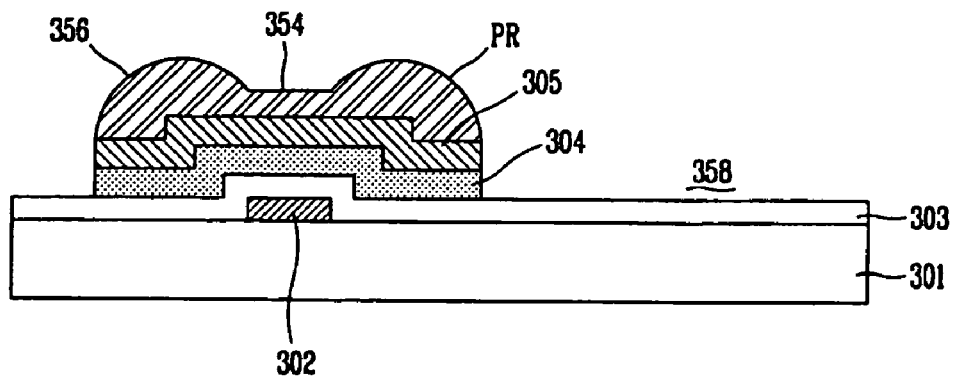

In particular, FIG. 3D shows that in the normal exposure regions (e.g., region 358), the photoresist PR is etched until the gate insulating layer 303 is exposed, while the region 354 experiences, due to the diffraction exposure, a lesser degree of etching that makes the region 354 step down (e.g., thinner) from the region 356. Therefore, as shown in FIG. 3E, an ashing process may selectively remove the thinner region 354 without removing the photoresist in region 356, for example, by blowing a gas including an oxygen free radical into the fabrication chamber.

Figure 3E:
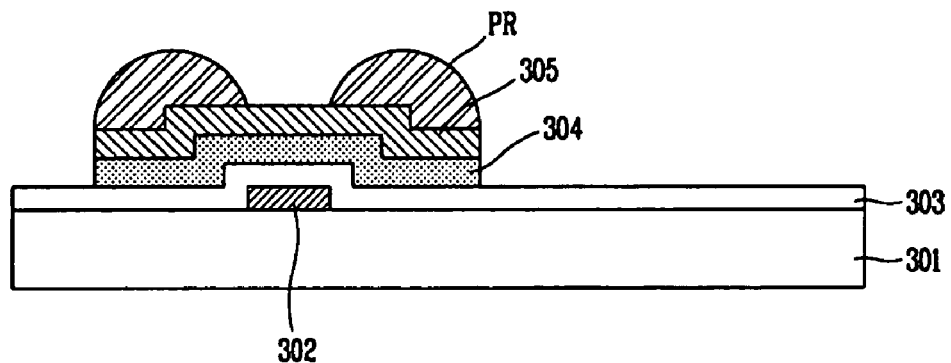

FIG. 3E shows that the ashing process is applied very precisely in order to remove the photoresist PR region 354. In other words, the photoresist PR remains above a source region and a drain region where source and drain electrodes will be formed. Precisely controlling the ashing process allows each TFT to have consistent channel lengths, source electrode size, and drain electrode size. Note therefore, that the TFTs formed in each TFT array substrate 202 generally share the same channel characteristics and can be fabricated at the same time using the same four masks.

Figure 3F:
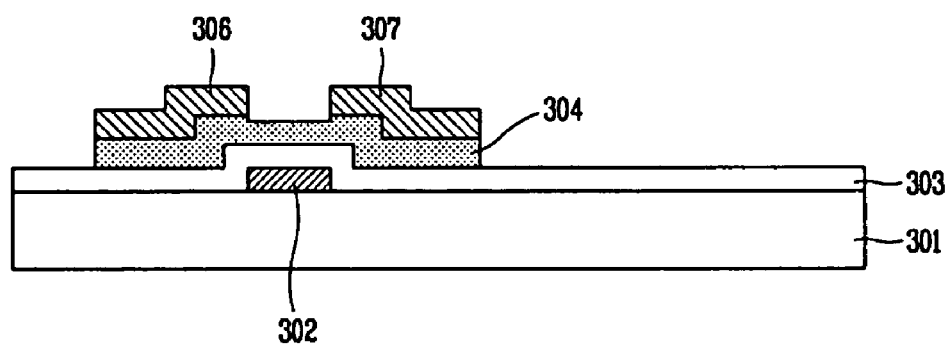

After passing through the ashing process, the photoresist PR, as shown in FIG. 3E, forms a pattern for a subsequent etching step. More specifically, as shown in FIG. 3F, the exposed conductive layer 305 on the channel area is etched according to the photoresist PR pattern. Additionally, the n+ material of the active layer 304 is etched, and the source electrode 306 and the drain electrode 307 are formed. The separated source electrode 306 and drain electrode 307 are supported on the active layer 304. Next, the photoresist PR remaining on the source electrode 306 and drain electrode 307 is removed to finish formation of the two electrodes 306, 307.

Figure 3G:
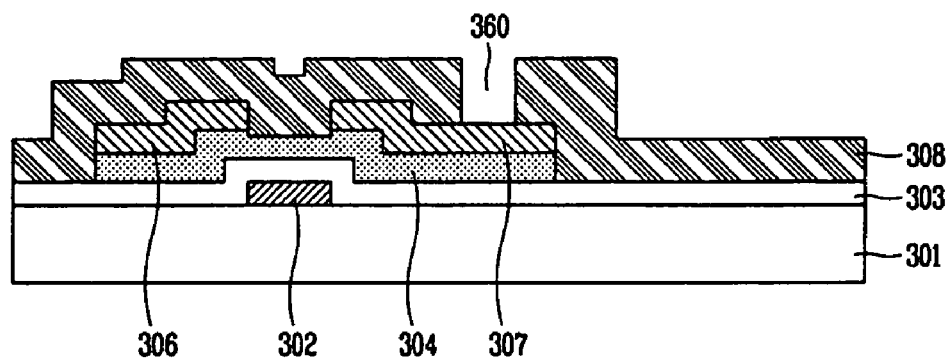

In addition, in order to insulate and protect the source electrode 306 and the drain electrode 307, a passivation layer 308 (e.g., a SiNx material) is formed on the upper surface of the glass substrate 301 as shown in FIG. 3G. FIG. 3G also shows the result of a photolithography process performed to form a contact hole 360 defined by a third mask that, through selective etching, exposes a part of the drain electrode 307 on the active area.

Figure 3H:
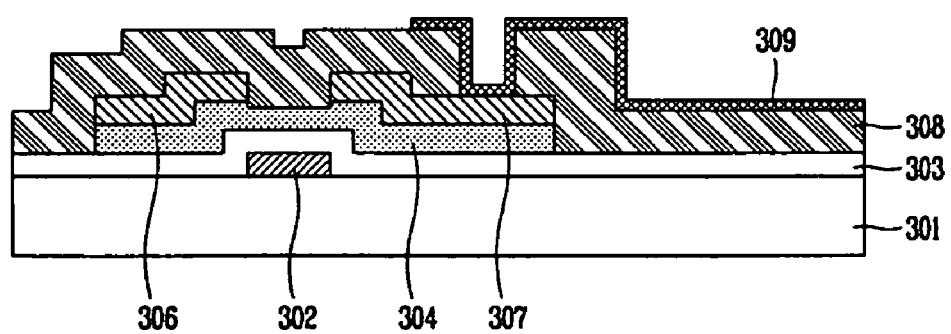

Subsequently, as shown in FIG. 3H, a transparent electrode material is formed over the resulting structures, and a photolithography process is performed through a fourth mask to form the pixel electrodes 309. The pixel electrodes 309 are connected to the drain electrode 307 through the contact hole 360.

The four-mask process described above produces TFTs for all the TFT array substrates 202 on a common glass substrate 201 that share the same switching device sizes and fabrication standards and characteristics.

Figure 4:
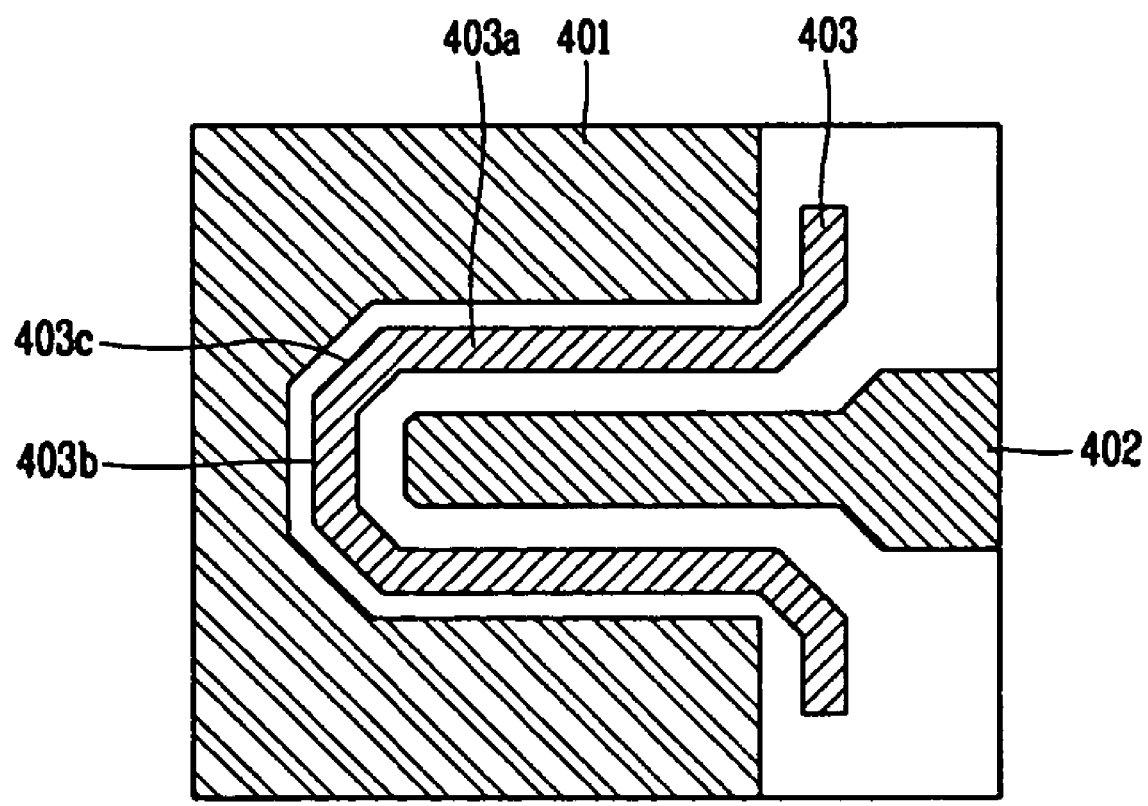
FIG. 4 depicts a diffraction mask that may be employed in the four mask TFT fabrication process.

As noted above with regard to FIG. 3C, the four-mask process includes the diffraction slit mask 350. FIG. 4 shows one example of a suitable slit mask. As shown in FIG. 4, the slit mask includes a U-shaped source forming pattern 401, a '-'-shaped drain forming pattern 402, and a slit-pattern 403 that acts as a channel pattern formed between the source and drain electrode patterns 401 and 402. The channel pattern shown increases the size of the TFT channel between the source and drain electrodes 306, 307 for enhanced signal characteristics.

Noted that the bar-shaped drain forming pattern 402 extents into a concave portion of the source forming pattern 401. A predetermined distance is maintained from the three sides of the concave portion. The slit-pattern 403 includes a horizontal unit 403a formed in the separation between the source forming pattern 401 and the drain forming pattern 402 along the longer side of the drain forming pattern 402. The slit-pattern also includes a vertical unit 403b with a generally vertical (e.g., perpendicular) orientation with respect to the longer side of the drain forming pattern 402, as well as a slant pattern unit 403c where the horizontal unit 403a meets the vertical unit 403b. The structure of the slit mask is not limited to a 'U' shape, but may vary widely according to the desired properties of the switching device.

After completing the TFT forming processes as explained above, an LCD panel forming process is carried out. The LCD panel forming process includes forming an alignment layer by applying an alignment layer that decides an initial orientation of the liquid crystal, and rubbing the alignment layer (e.g., with a cloth or the like) to determine the initial orientation of the liquid crystal. The forming process also includes forming a seal pattern on an outer portion of the active area on which each TFT array substrate is formed in order to attach a separately fabricated upper color filter substrate to the TFT array substrate. In addition, the process includes scattering spacers for separating the TFT array substrate and the upper color filter substrate to maintain a pre-selected gap between the two substrates, attaching the upper color filter substrate and the lower TFT array substrate, and cutting the attached assembly into unit liquid crystal cells. Furthermore, the process includes injecting liquid crystal into the unit cells through injection holes and then sealing the liquid crystal injecting hole. Note that a separately prepared common glass substrate may also be used to fabricate the upper color filter substrates to match respective TFT array substrates.

Using the process described above, each resultant LCD panel includes switching devices that adhere to the same manufacturing standards and properties (e.g., TFT channel characteristics) even though the LCD panels have different screen sizes. As a result, the same quality control measures (e.g., a channel inferiority check) may be applied to the all of the panels and quality control becomes easier and more efficient.

Figure 5:
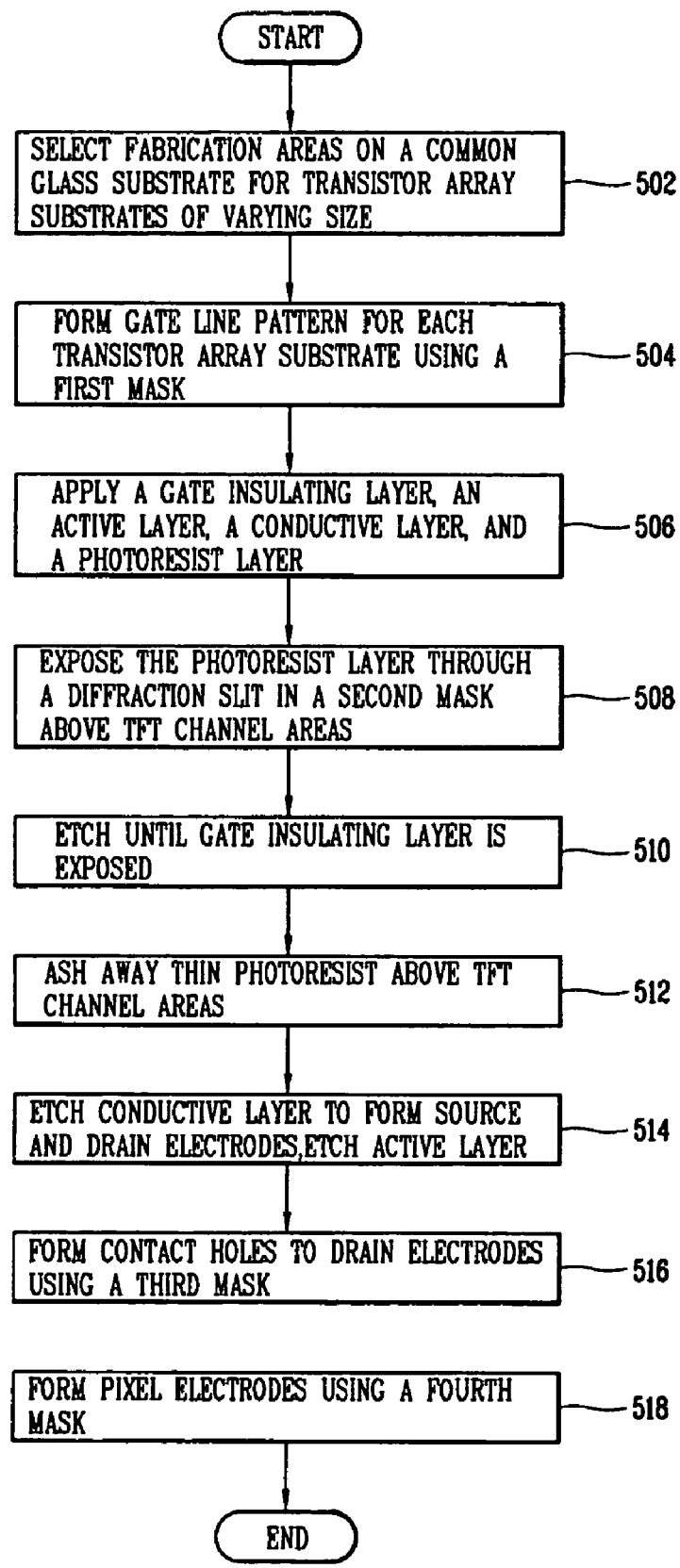
FIG. 5 shows a method for fabricating a transistor array substrate for an LCD panel.

With regard to FIG. 5, that figure summarizes a method for fabricating a transistor array substrate for an LCD panel. The fabrication steps include selecting fabrication areas on a common glass substrate for the transistor array substrates (Step 502). As noted above, each transistor array substrate may vary in size. Subsequently, the fabrication process forms gate line patterns for each transistor array substrate using a photolithography process in conjunction with a first mask (Step 504). Afterwards, a gate insulating layer 303, an active layer 304, a conductive layer 305, and a photoresist layer PR are deposited (Step 506).

As part of the process of forming the TFT channels, a second mask 350 is employed to produce a diffraction exposure of the photoresist PR above the TFT channel areas (Step 508), as well as normal exposure of the photoresist PR in other areas. As a result, each TFT array substrate may then be etched until the gate insulating layer 303 is exposed (Step 510), while maintaining a thin photoresist PR above the TFT channel areas.

The photoresist PR may then be removed, for example, through an ashing process to expose the conductive layer 305 in the channel areas (Step 512). At this stage, the fabrication process etches the conductive layer 305 and the active layer 304 to form separate source and drain electrodes 306, 307 (Step 514). A third mask and photolithography process then form contact holes to drain electrodes 307 (step 516), while a fourth mask is employed to form the pixel electrodes (Step 518).

As the present invention may be embodied in several forms without departing from the spirit or essential characteristics thereof, it should also be understood that the above-described embodiments are not limited by any of the details of the foregoing description, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A fabrication method for multiple LCD panel models from transistor array substrates formed on a common substrate, the method comprising the steps of:
    selecting areas on the common substrate where switching array substrates of different sizes will be formed;
    fabricating switching devices using a common set of masks for each of the switching array substrates;
    forming an alignment layer on each of the transistor array substrates;
    forming a seal pattern around each of the transistor array substrates;
    scattering spacers onto each transistor array substrate;
    attaching the common substrate on which the switching devices are formed to a color filter substrate to form an LCD display panel;
    cutting the LCD display panel into individual LCD panel models; and
    disposing liquid crystal in each of the panel models through a liquid crystal injecting hole.

2. The method of claim 1, wherein the switching devices are thin film transistors.

3. The method of claim 1, wherein the step of fabricating comprises the step of fabricating through a four mask process that includes a diffraction slit mask.

4. The method of claim 3, wherein the slit mask includes a 'U'-shaped channel slit-pattern.

5. The method of claim 3, wherein the slit mask comprises a 'U'-shaped source forming pattern, a bar-shaped drain forming pattern, and a channel slit-pattern between the source forming pattern and the drain forming pattern.

6. The method of claim 1, wherein the step of fabricating switching devices comprises:
    forming a gate electrode on the common substrate;
    forming a gate insulating layer;
    forming an active layer on the gate insulating layer;
    forming source and drain electrodes on the active layer;
    forming a passivation layer on the common substrate; and
    forming pixel electrodes connected to the drain electrodes.

7. The method of claim 1, further comprising the step of sealing the liquid crystal injecting hole.

8. A fabrication method for multiple transistor array substrates on a common substrate for multiple LCD panel models, the method comprising the steps of:
    selecting areas on the common substrate where switching array substrates of different sizes will be formed;
    fabricating the switching devices for each switching array substrate, regardless of size, through a multiple-mask process that applies the same masks for each switching array substrate.

9. The method of claim 8, where the step of forming the switching devices comprises the steps of:
    fabricating gate lines on each switching array substrate;
    forming a gate insulating layer for insulating the gate lines;
    forming an active layer on the gate insulating layer;
    forming source and drain electrodes on the active layer;
    forming a passivation layer on the common substrate; and
    forming a pixel electrode on the passivation layer.

10. The method of claim 8, where the switching device is a thin film transistor.

* * * * *